United States Patent
Ueno (10) Patent No.: US 8,414,968 B2
(45) Date of Patent: Apr. 9, 2013

(54) IN-LINE FILM FORMING APPARATUS AND MANUFACTURING METHOD OF MAGNETIC RECORDING MEDIUM

(75) Inventor: Satoru Ueno, Chiba (JP)

(73) Assignee: Showa Denko K.K., Tokyo (JP)

( * ) Notice: Subject to any disclaimer, the term of this patent is extended or adjusted under 35 U.S.C. 154(b) by 818 days.

(21) Appl. No.: 12/491,887

(22) Filed: Jun. 25, 2009

(65) Prior Publication Data

US 2009/0324813 A1 Dec. 31, 2009

(30) Foreign Application Priority Data

Jun. 27, 2008 (JP) ................................. 2008-168630

(51) Int. Cl.
*G11B 5/00* (2006.01)
*G11B 17/00* (2006.01)
*G11B 21/00* (2006.01)
*H01L 21/677* (2006.01)
*B66C 1/00* (2006.01)
*B65G 15/58* (2006.01)

(52) U.S. Cl. .............. 427/128; 204/298.15; 204/298.16; 204/298.23; 204/298.25; 118/728; 118/729; 414/217; 414/729; 427/127; 198/468.5

(58) Field of Classification Search ............. 204/298.15, 204/298.16, 298.23, 298.25; 118/728, 729; 414/217, 729; 427/127
See application file for complete search history.

(56) References Cited

U.S. PATENT DOCUMENTS

| | | | | |
|---|---|---|---|---|
| 5,207,513 A | * | 5/1993 | Kondo et al. | 384/492 |
| 5,909,995 A | * | 6/1999 | Wolf et al. | 414/217 |
| 6,027,618 A | * | 2/2000 | Aruga et al. | 204/192.12 |
| 6,280,095 B1 | * | 8/2001 | Furukoshi et al. | 384/489 |
| 2008/0063330 A1 | * | 3/2008 | Orlowski et al. | 384/448 |
| 2011/0014363 A1 | | 1/2011 | Ueno | |

FOREIGN PATENT DOCUMENTS

| | | |
|---|---|---|
| JP | 5-17915 U | 3/1993 |
| JP | 8-335620 A | 12/1996 |
| JP | 2000-337391 A | 12/2000 |
| JP | 2002-288888 A | 10/2002 |
| JP | 2007-270188 A | 10/2007 |
| WO | 01/83843 A1 | 11/2001 |
| WO | 2006/026886 A1 | 3/2006 |
| WO | 2009/107740 A1 | 9/2009 |

OTHER PUBLICATIONS

Notice of Allowance dated Dec. 1, 2009, issued in Singapore Patent Application No. 200904377-9.
Japanese Office Action issued in Japanese Application No. 2008-168630 mailed Jul. 3, 2012.

* cited by examiner

*Primary Examiner* — Timothy Meeks
*Assistant Examiner* — Mandy Louie
(74) *Attorney, Agent, or Firm* — Sughrue Mion, PLLC

(57) ABSTRACT

An in-line film forming apparatus capable of conveying a carrier at a high speed, increasing the exhaust capability within a film forming chamber, and easily realizing a high vacuum degree in a short time is provided. A conveyor mechanism has a linear motor drive mechanism which drives the carrier in a noncontact state, a horizontal guide mechanism which is provided so as to be able to contact a side portion of the carrier, and guides the carrier driven by the linear motor drive mechanism in a horizontal direction, and a vertical guide mechanism which is provided so as to be able to contact a lower end of the carrier, and guides the carrier driven by the linear motor drive mechanism in the vertical direction.

6 Claims, 9 Drawing Sheets

IN-LINE FILM FORMING APPARATUS AND MANUFACTURING METHOD OF MAGNETIC RECORDING MEDIUM

CROSS REFERENCE TO RELATED APPLICATION

Priority is claimed on Japanese Patent Application No. 2008-168630, filed Jun. 27, 2008, the content of which is incorporated herein by reference

BACKGROUND OF THE INVENTION

1. Field of the Invention

The present invention relates to an in-line film forming apparatus which perform film forming processing while a substrate serving as an object to be film-formed is sequentially conveyed between a plurality of film forming chambers and a manufacturing method of a magnetic recording medium using the in-line film forming apparatus.

2. Description of Related Art

In recent years, in the field of magnetic recording media used for hard disk devices or the like, the improvement in recording density is remarkable. Particularly, these days, recording density continues to increase at an amazing speed of about 100 times every ten years.

Such a magnetic recording medium has, for example, a structure on which a seed film, a underlayer film, a magnetic recording film, a protective film, and a lubricant film are sequentially laminated on both surfaces or one surface of a nonmagnetic substrate, and is generally manufactured using an in-line film forming apparatus which performs film forming processing while a substrate serving as an object to be film-formed is sequentially conveyed between a plurality of film forming chambers.

Meanwhile, in the in-line film forming apparatus, for example, a conveyor mechanism which conveys a carrier by magnetic attraction with magnets provided on the side of a carrier and magnets provided on the side of a film forming chamber is suggested as a method of conveying the carrier holding a substrate (see Patent Document 1).

Specifically, a conveyor mechanism which conveys the carrier by arranging a plurality of magnets so that an N pole and an S pole are alternately aligned at a lower part of the carrier, arranging along a conveying path a rotary magnet in which an N pole and an S pole are spirally and alternately aligned below the magnets, and rotating the rotary magnet around an axis while the magnets on the side of the carrier and the rotary magnet in non-contact are combined magnetically is described in Patent Document 1.

However, in the conveyor mechanism described in Patent Document 1, when the rotary magnet is rotated upward with respect to the lower surface of the carrier, the carrier may be lifted upward by the attractive force between both magnets and the carrier may vibrate greatly. On the other hand, when the rotary magnet is rotated downward with respect to the lower surface of the carrier, the carrier may be pushed against bearings holding the carrier, and movement of the carrier may worsen.

In order to solve such a problem, a method of guiding the carrier by bearings or the like so that the carrier does not move upward, or increasing number of downward bearings can be considered. However, when the number of bearings holding the carrier increases, there is a possibility that movement of the carrier may worsen or the degree of vacuum of a film forming chamber may deteriorate due to degassing from the bearings.

Additionally, it is desirable that a vacuum pump acting as a heavy load is arranged in the lower portion of a film forming chamber. However, when the rotary magnet and a drive mechanism which rotate the rotary magnet are set in the lower portion of the film forming chamber, they may cover an exhaust pipe connected to the vacuum pump, and exhaust by the vacuum pump within the film forming chamber may be obstructed.

Additionally, in manufacturing a magnetic recording medium using the in-line film forming apparatus, increasing the conveyance speed of the carrier is required in order to enhance production capacity. However, since the conveyor mechanism described in the above Patent Document 1 has a limit on increasing the rotating speed of the rotary magnet, it is difficult to increase the conveyance speed of the carrier.

Additionally, in the conveyor mechanism described in the above Patent Document 1, it is necessary to prevent the carrier from falling under its own weight through the use of the bearings. However, since it is difficult to use fluid lubricant on the bearings to be used in a vacuum, the rotation characteristic of the bearings worsens when a large load is applied to the bearings. Accordingly, in this case, it is difficult to move the carrier at a high speed.

Additionally, in order to increase the degree of vacuum within the film forming chamber, it is desirable to arrange the rotary magnet and its drive mechanism outside the film forming chamber. However, the inner structure within a film forming apparatus becomes complicated, and it becomes difficult to secure a high degree of vacuum in the film forming chamber due to leakage from the mechanism and its sealing parts.

In addition, as a method of conveying the carrier, using a linear motor is also suggested in order to improve the capability of a conveyance system of a disc substrate (see Patent Document 2).

Patent Document 1: Japanese Patent Unexamined Publication No. 2002-288888.
Patent Document 2: Japanese Patent Unexamined Publication No. Hei 8-335620.

SUMMARY OF THE INVENTION

The present invention is suggested in view of the conventional situation above, and aims at providing an in-line film forming apparatus capable of conveying a carrier at a high speed, increasing the exhaust capability within a film forming chamber, enabling the easy realization of a high vacuum degree in a short time, and providing a manufacturing method of a magnetic recording medium using such an in-line film forming apparatus.

The present invention provides the following.

(1) An in-line film forming apparatus including a plurality of film forming chambers which perform film forming processing; a carrier which holds a substrate serving as an object to be film-formed within the plurality of film forming chambers in a vertical arrangement; and a conveyor mechanism which sequentially conveys the carrier through the plurality of film forming chambers. The conveyor mechanism has a linear motor drive mechanism which drives the carrier in a noncontact state, a horizontal guide mechanism which is provided so as to be able to contact a side portion of the carrier, and guides the carrier driven by the linear motor drive mechanism in a horizontal direction, and a vertical guide mechanism which is provided so as to be able to contact a lower end of the carrier, and guides the carrier driven by the linear motor drive mechanism in the vertical direction. The horizontal guide mechanism or the vertical guide mechanism has a plurality of bearings rotatably attached to a plurality of shafts arranged in a conveying direction of the carrier via a damping member, and the noncontact state between the shafts and the bearings is maintained via the damping member.

(2) The in-line film forming apparatus according to the preceding item (1) in which the damping member is an O ring.

(3) The in-line film forming apparatus according to the preceding item (1) or (2), further includes a sensor which detects contact with the shafts and the bearings.

(4) The in-line film forming apparatus according to any one of the preceding items (1) to (3) in which the load applied per bearing constituting the vertical guide mechanism is 0 N, or the load applied per bearing that the carrier has contact with is less than or equal to 9.8 N.

(5) The in-line film forming apparatus according to any one of the preceding items (1) to (4) in which the load applied per one of the bearings that the carrier has contact with among the plurality of bearings which constitute the horizontal guide mechanism is less than or equal to 98 N.

(6) The in-line film forming apparatus according to any one of the preceding items (1) to (5) in which the linear motor drive mechanism has a magnetic body provided at a side portion of the carrier, and a plurality of electromagnets arranged in the conveying direction of the carrier at a position which faces the magnetic body.

(7) The in-line film forming apparatus according to the preceding item (6) in which the magnetic body is a permanent magnet.

(8) The in-line film forming apparatus according to the preceding item (6) or (7) in which the electromagnets are provided outside the film forming chambers.

(9) A manufacturing method of a magnetic recording medium including a step of forming at least a magnetic layer on the surface of the substrate by using the in-line film forming apparatus according to any one of the preceding items (1) to (8).

According to the present invention, the carrier can be conveyed at a high speed, the exhaust capability within the film forming chambers can be increased, and a high vacuum degree can be easily realized in a short time. Therefore, it can enhance the manufacturing capacity of magnetic recording media, and it can manufacture high-quality magnetic recording media.

DETAILED DESCRIPTION OF THE INVENTION

Hereinafter, an embodiment of the present invention will be described in detail with reference to the drawings.

In this embodiment, a case will be described as an example where a magnetic recording medium mounted on a hard disk device is manufactured using an in-line film forming apparatus which performs film forming processing while a substrate serving as an object to be film-formed is sequentially conveyed between a plurality of film forming chambers.

Figure 1:
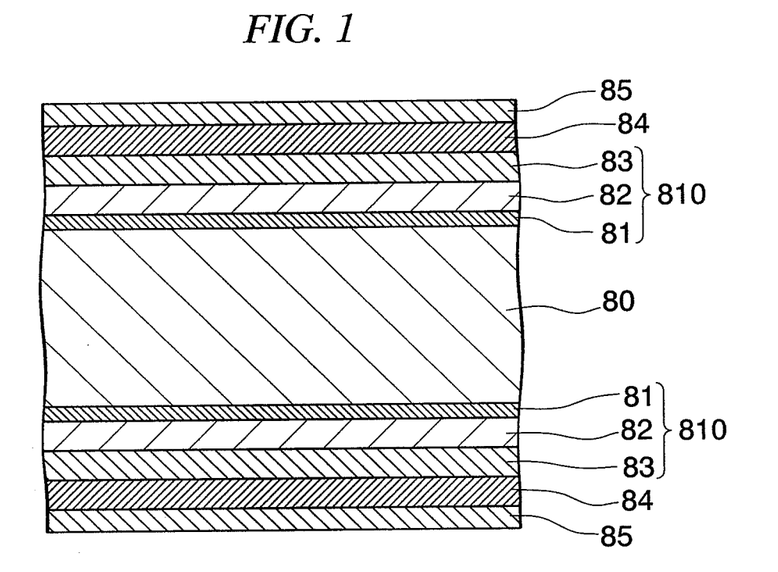
FIG. 1 is a sectional view showing an example of a magnetic recording medium manufactured by applying the present invention.

For example, as illustrated in FIG. 1, a magnetic recording medium manufactured by applying the present invention has a structure where a soft magnetic layer 81, an interlayer 82, a recording magnetic layer 83, and a protective layer 84 are sequentially laminated on both surfaces of a nonmagnetic substrate 80, and further has a lubricating film 85 formed on the outermost surface thereof. Additionally, a magnetic layer 810 is constituted by the soft magnetic layer 81, the interlayer 82, and the recording magnetic layer 83.

Arbitrary nonmagnetic substrates can be used as the nonmagnetic substrate 80, such as Al alloy substrates made of Al—Mg alloy or the like, which are composed mainly of Al, or substrates made of normal soda glass, aluminosilicate-based glass, crystallized glass, silicone, titanium, ceramics, or various resins.

Among them, it is preferable to use Al alloy substrates, glass substrates, such as crystallized glass, and silicon substrates. Additionally, the average surface roughness (Ra) of these substrates is preferably less than or equal to 1 nm, and more preferably less than or equal to 0.5 nm. Among these, it is particularly preferable that the average surface roughness be less than or equal to 0.1 nm.

Although the magnetic layer 810 can be an in-plane magnetic layer for an in-plane magnetic recording medium or a perpendicular magnetic layer for a perpendicular magnetic recording medium, the perpendicular magnetic layer is preferable in order to realize a higher recording density. Additionally, it is preferable that the magnetic layer 810 be formed from alloys composed mainly of Co. For example, a magnetic layer in which the soft magnetic layer 81 made of soft magnetic FeCo alloys (FeCoB, FeCoSiB, FeCoZr, FeCoZrB, FeCoZrBCu, etc.), FeTa alloys (FeTaN, FeTaC, etc.), Co alloys (CoTaZr, CoZrNB, CoB, etc.), or the like; the interlayer 82 made of Ru or the like; and the recording magnetic layer 83 made of a 60Co-15Cr-15 Pt alloy or a 70Co-5Cr-15Pt-10SiO$_2$ alloy are laminated, can be utilized as the magnetic layer 810 for a perpendicular magnetic recording media.

Additionally, an alignment control film made of Pt, Pd, NiCr, NiFeCr, or the like may be laminated between the soft magnetic layer 81 and the interlayer 82. On the other hand, a magnetic layer in which a nonmagnetic CrMo foundation layer and a ferromagnetic CoCrPtTa magnetic layer are laminated, can be utilized as the magnetic layer 810 for an in-plane magnetic recording medium.

The thickness of the whole magnetic layer 810 may be set to be greater than or equal to 3 nm and less than or equal to 20 nm, more preferably, greater than or equal to 5 nm and less than or equal to 15 nm, and as long as the magnetic layer 810 may be formed so that a sufficient head input or output is acquired in accordance with the kind of, and laminated structure of, a magnetic alloy to be used. The film of the magnetic layer 810 needs the film thickness of a certain value or more to obtain the output of a fixed value or more during reproduction. On the other hand, since all parameters which show recording/reproducing characteristics usually deteriorate with a rise in output, it is necessary to set the above film thickness to an optimal film thickness.

As the protective layer 84, normal protective film materials such as carbonaceous layers including carbon (C), hydrogenated carbon ($H_xC$), nitrogenated carbon (CN), amorphous carbon, or silicon carbide (SiC); and $SiO2$, $Zr_2O_3$ or TiN layer can be used. Additionally, the protective layer 84 may be composed of two or more layers. The film thickness of the protective layer 84 needs to be less than 10 nm. This is because, when the film thickness of the protective layer 84 exceeds 10 nm, the distance between a head and the recording magnetic layer 83 becomes large, and sufficient input/output signal intensity is not obtained.

As lubricant used for the lubricating film 85, fluorine-based lubricant, hydrocarbon-based lubricant, and mixtures thereof can be mentioned, and the lubricating film 85 is usually formed with a thickness of 1 to 4 nm.

Figure 2:
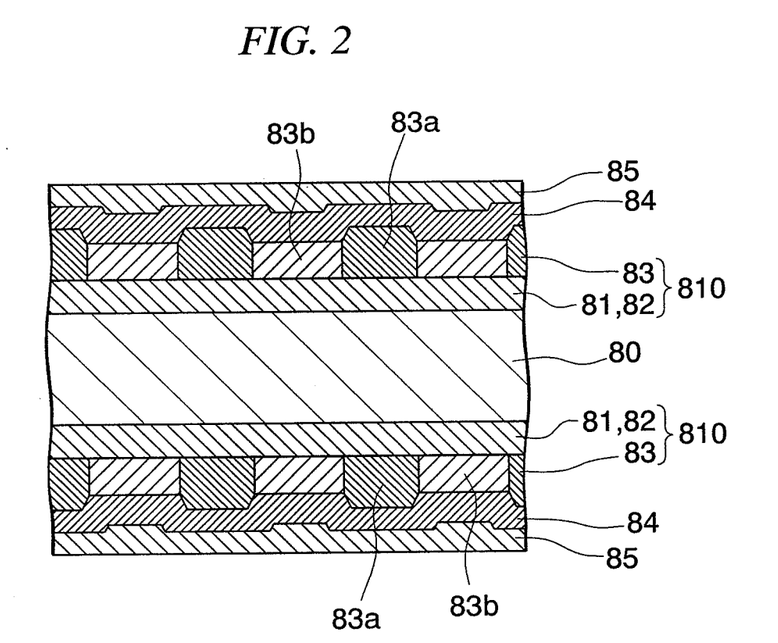
FIG. 2 is a sectional view showing another example of a magnetic recording medium manufactured by applying the present invention.

Additionally, for example, as illustrated in FIG. 2, the magnetic recording medium manufactured by applying the present invention may be a so-called discrete magnetic recording medium in which a magnetic recording pattern 83a formed in the above recording magnetic layer 83 is separated by a nonmagnetic region 83b.

Additionally, with regard to the discrete magnetic recording medium, so-called patterned media in which the magnetic recording pattern 83a is arranged with fixed regularity per one bit, or media in which the magnetic recording pattern 83a is arranged in the shape of a track, and other magnetic recording patterns 83a may include a servo signal pattern, for example.

Such a discrete magnetic recording medium is obtained by providing a mask layer on the surface of the recording magnetic layer 83, exposing a part which is not covered with the mask layer to reactive plasma treatment, ion irradiation treatment, or the like, thereby modifying a portion of the recording magnetic layer 83 from a magnetic body to a nonmagnetic body, and forming the nonmagnetic region 83b.

Figure 3:
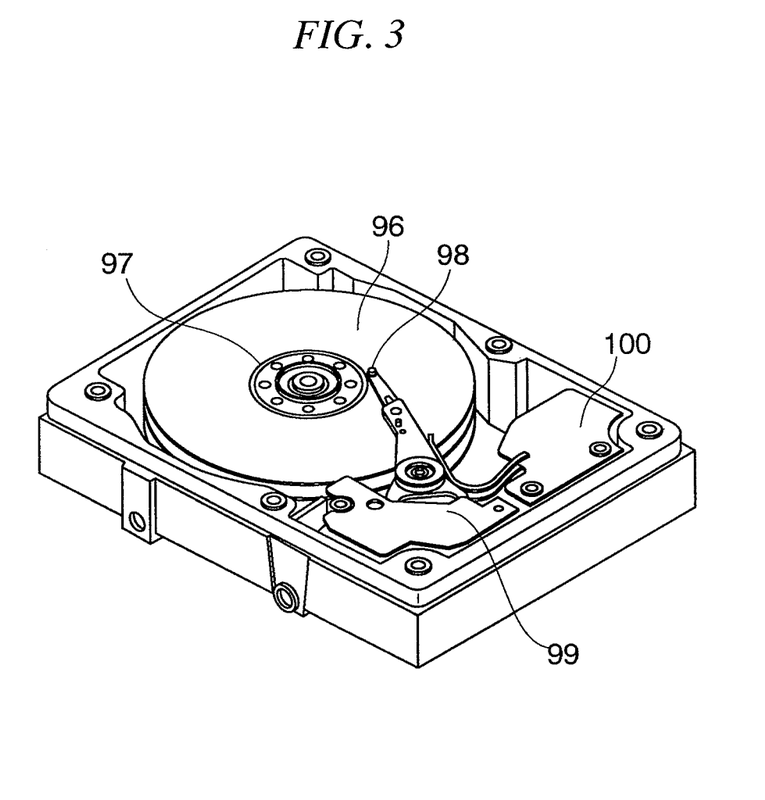
FIG. 3 is a perspective view showing an example of a magnetic recording and reproducing apparatus.

Additionally, as a magnetic recording and reproducing apparatus using the above magnetic recording medium, for example, a hard disk device as illustrated in FIG. 3 can be mentioned. The hard disk device includes a magnetic disk 96 which is the above magnetic recording medium, a medium driver 97 which rotationally drives the magnetic disk 96, a magnetic head 98 which records/reproduces information on/from the magnetic disk 96, a head actuator 99, and a recording and reproducing signal system 100. The magnetic reproducing signal system 100 processes input data to send a recording signal to the magnetic head 98, and processes a reproduced signal from the magnetic head 98 to output data.

Figure 4:
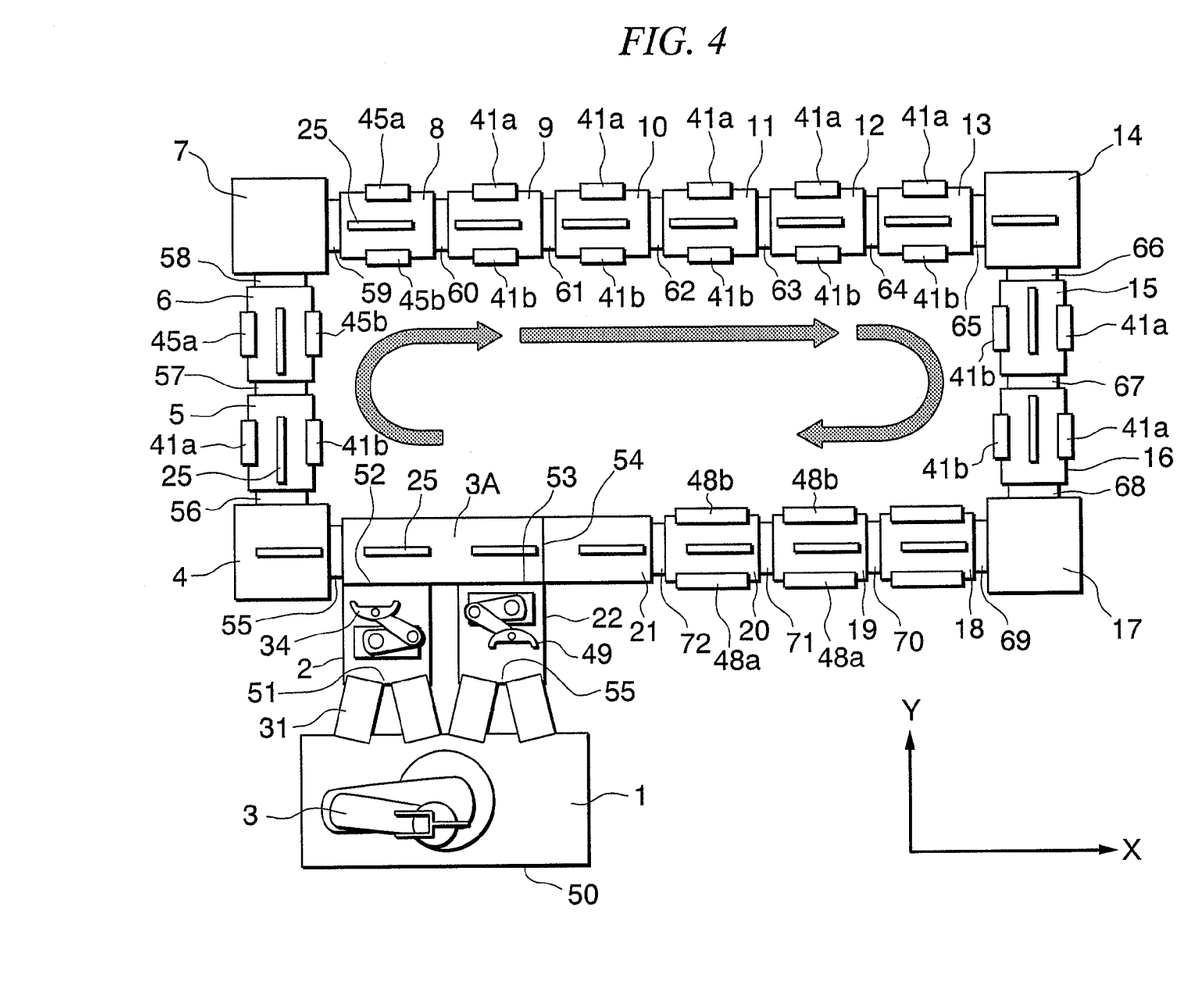
FIG. 4 is a plan view illustrating the configuration of an in-line film forming apparatus to which the present invention is applied.

When the above magnetic recording medium is manufactured, for example, as illustrated in FIG. 4, a high-quality magnetic recording medium can stably be obtained by passing through the steps of sequentially laminating at least the soft magnetic layer 81, the interlayer 82, and the recording magnetic layer 83 on both surfaces of the nonmagnetic substrate 80 serving as an object to be film-formed by using the in-line film forming apparatus (manufacturing apparatus of a magnetic recording medium) to which the present invention is applied, and forming the magnetic layer 810.

Specifically, the in-line film forming apparatus to which the present invention is applied roughly has a substrate cassette transfer robotic armic arm base 1, a substrate cassette transfer robotic arm 3 placed on the robotic arm base 1, a substrate supply robotic arm chamber 2 adjacent to the robotic arm base 1, a substrate supply robotic arm 34 arranged within the substrate supply robotic arm chamber 2, a substrate attachment chamber 52 adjacent to the substrate supply robotic arm chamber 2, corner chambers 4, 7, 14, and 17 which rotate carriers 25, treatment chambers 5, 6, 8 to 13, 15, 16, and 18 to 20 arranged between the corner chambers 4, 7, 14, and 17, a substrate detachment chamber 54 arranged adjacent to the treatment chamber 20, an ashing chamber 3A arranged between the substrate attachment chamber 52 and the substrate detachment chamber 54, a substrate detachment robotic arm chamber 22 arranged adjacent to the substrate detachment chamber 54, a substrate detachment robotic arm 49 set within the substrate detachment robotic arm chamber 22, and a plurality of carriers 25 conveyed between the chambers.

Additionally, two adjacent chambers of chambers 2, 52, 4 to 20, 54, and 3A are connected to each other by two adjacent wall portions, and connecting portions between chambers 2, 52, 4 to 20, 54, and 3A are provided with gate valves 55 to 71. When the gate valves 55 to 71 are in a closed state, the interior of each chamber becomes an independent enclosed space.

Additionally, vacuum pumps (not shown) are connected to the chambers 2, 52, 4 to 20, 54, and 3A. A magnetic recording medium illustrated in the above-mentioned FIG. 1 is finally obtained by sequentially film-forming the above-described soft magnetic layer 81, interlayer 82, recording magnetic layer 83, and protective layer 84 on both surfaces of the nonmagnetic substrate 80 mounted to each carrier 25 within each chamber while the carriers 25 are sequentially conveyed to the interiors of the each of above-mentioned chambers which are brought into a pressure-reduced state by operation of these vacuum pumps, by a conveyor mechanism which will be described later. Additionally, each of the corner chambers 4, 7, 14, and 17 is a chamber where the movement direction of each carrier 25 is changed, and the inside of the chamber is provided with a mechanism which rotates the carrier 25 to move to the next film forming chamber.

The substrate cassette transfer robotic arm 3 supplies the nonmagnetic substrate 80 to the substrate attachment chamber 2 from a cassette in which the nonmagnetic substrate 80 before film formation is received, and removes the nonmagnetic substrate 80 (magnetic recording medium) detached in the substrate detachment chamber 22 after the film formation. An opening opened to the outside and 51 and 55 which opens and closes this opening are provided at one side wall of the substrate attachment/detachment chambers 2 and 22.

Inside the substrate attachment chamber 52, the nonmagnetic substrate 80 before film formation is mounted on the carrier 25 by the substrate supply robotic arm 34. On the other hand, inside the substrate detachment chamber 54, the nonmagnetic substrate 80 (magnetic recording medium) after the film formation mounted on the carrier 25 is detached using the substrate detachment robotic arm 49. The ashing chamber 3A conveys the carrier 25 to the substrate attachment chamber 52 after ashing of the carrier 25 conveyed from the substrate detachment chamber 54 is performed.

A plurality of film forming chambers where film forming processing is performed are constituted by the treatment chambers 5, 6, 8 to 13, 15, and 16 among the treatment chambers 5, 6, 8 to 13, 15, 16, and 18 to 20. These film forming chambers include a mechanism which forms the above-described soft magnetic layer 81, interlayer 82, and recording magnetic layer 83 on both surfaces of the nonmagnetic substrate 80. Additionally, protective film forming chambers are constituted by the treatment chambers 19 and 20. These protective film forming chambers include a mechanism which forms the protective layer 84 on the recording magnetic layer 83.

In addition, when the magnetic recording medium illustrated in the above FIG. 2 is manufactured in the treatment chambers, a patterning chamber where a mask layer is patterned, a modified chamber where reactive plasma treatment or ion irradiation treatment is modified on the portion of the recording magnetic layer 83 which is not covered with the mask layer after patterning, and a portion of the recording magnetic layer 83 is modified from a magnetic body to a nonmagnetic body, thereby forming the magnetic recording pattern 83a separated by the nonmagnetic region 83b, and a clearance chamber where the mask layer is removed may be added.

Additionally, the treatment chambers 5, 6, 8 to 13, 15, 16, and 18 to 20 are provided with processing gas supply pipes, and the supply pipes are provided with valves whose opening and closing are controlled by a control mechanism which is not shown. By operating these valves and the gate valves for pumps, the supply of gas from the processing gas supply pipes, the pressure within the chambers, and the discharge of gas are controlled.

Figure 5:
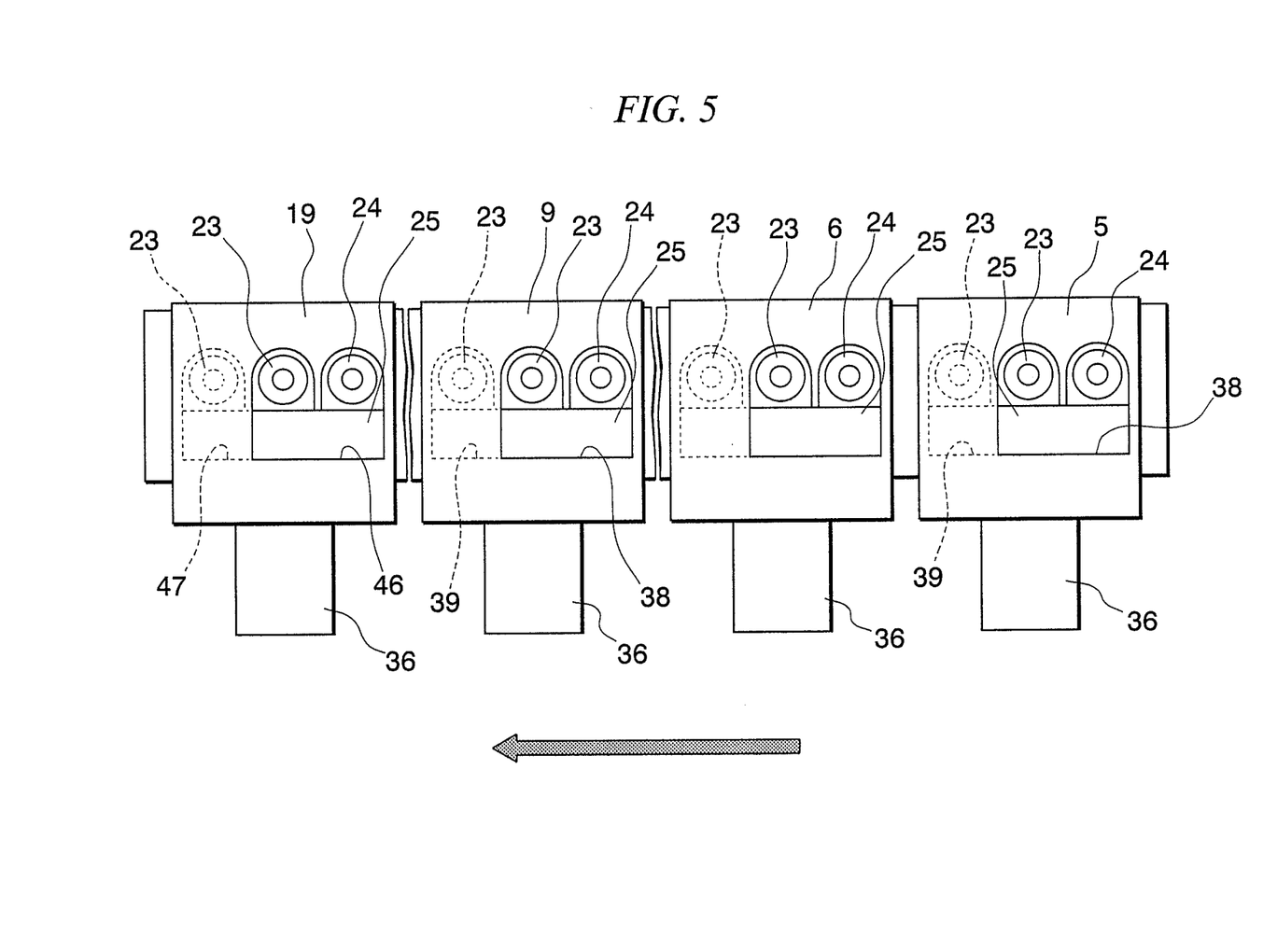
FIG. 5 is a side view illustrating a carrier of the in-line film forming apparatus to which the present invention is applied.
Figure 6:
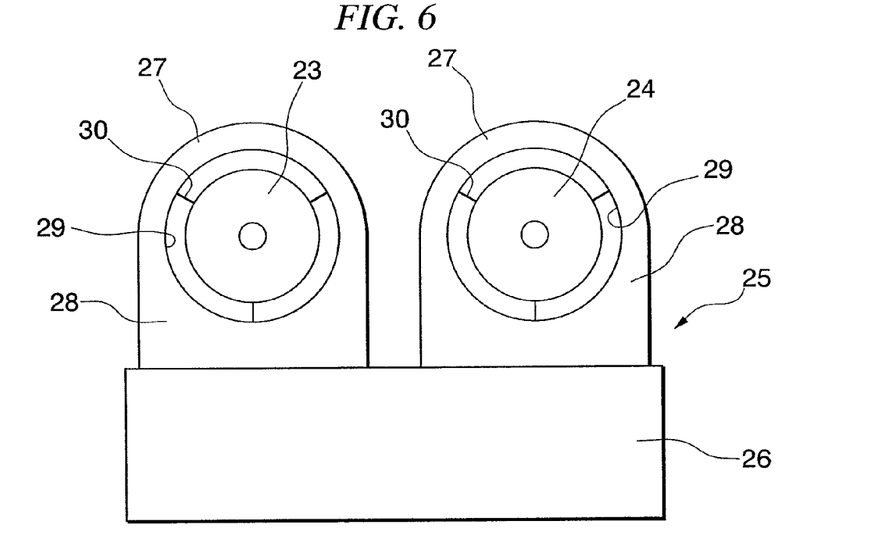
FIG. 6 is an exploded side view illustrating the carrier shown in FIG. 5.

The carrier 25, as illustrated in FIGS. 5 and 6, has a supporting base 26, and a plurality of substrate mounting portions 27 provided on the upper surface of the supporting base 26. In addition, since this embodiment has a configuration in which two substrate mounting portions 27 are mounted, two nonmagnetic substrates 80 to be mounted on the substrate mounting portions 27 shall be treated as a first film forming substrate 23 and a second film forming substrate 24.

The substrate mounting portion 27 is configured such that circular through holes 29 with a slightly larger diameter than the outer peripheries of the film forming substrates 23 and 24 are formed in plate bodies 28 having a thickness of about one or several times the thickness of the first and second film forming substrates 23 and 24, and a plurality of supporting members 30 which protrude toward the inside of the through holes 29 are provided around the through holes 29. In the substrate mounting portion 27, the first and second film forming substrates 23 and 24 are inserted into the through holes 29, and the supporting members 30 engage the edge of each through hole, whereby the film forming substrates 23 and 24 are held in a vertical arrangement (a state where the principal planes of the substrates 23 and 24 becomes parallel to the direction of gravity). That is, the substrate mounting portion 27 is provided parallel to the upper surface of the supporting base 26 such that the principal planes of the first and second film forming substrates 23 and 24 mounted on the carrier 25 are substantially orthogonal to the upper surface of the supporting base 26, and are substantially in the same plane.

Additionally, two treatment devices are on both sides of the carrier 25 in the above-described treatment chambers 5, 6, 8 to 13, 15, 16, and 18 to 20. In this case, for example, film forming processing or the like is performed on the left first film forming substrate 23 of the carrier 25 in a state where the carrier 25 has stopped at a first treatment position shown by a solid line in FIG. 5. Thereafter, film forming processing or the like can be performed on the right second film forming substrate 24 of the carrier 25 in a state where the carrier 25 has moved to a second treatment position shown by a broken line in FIG. 5, and the carrier 25 has stopped at the second treatment position.

In addition, when four treatment devices which face the first and second film forming substrates 23 and 24 are on both sides of the carrier 25, movement of the carrier 25 becomes unnecessary, and film forming processing or the like can be simultaneously performed on the first and second film forming substrates 23 and 24 held by the carrier 25.

Figure 7:
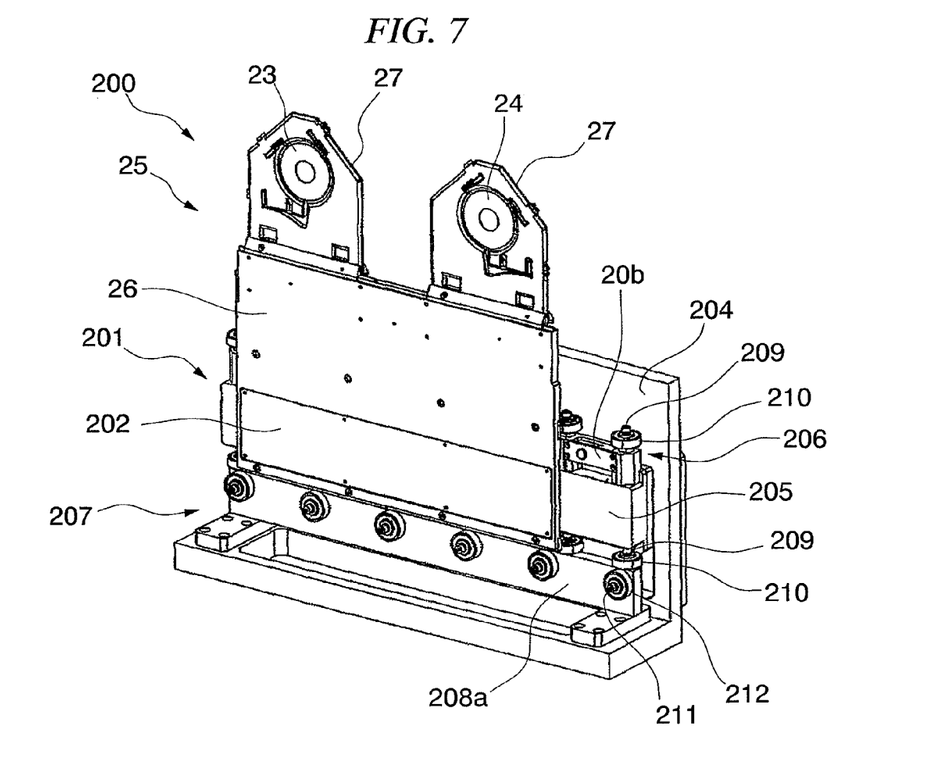
FIG. 7 is a perspective view illustrating a conveyor mechanism of the in-line film forming apparatus of the present invention.
Figure 8:
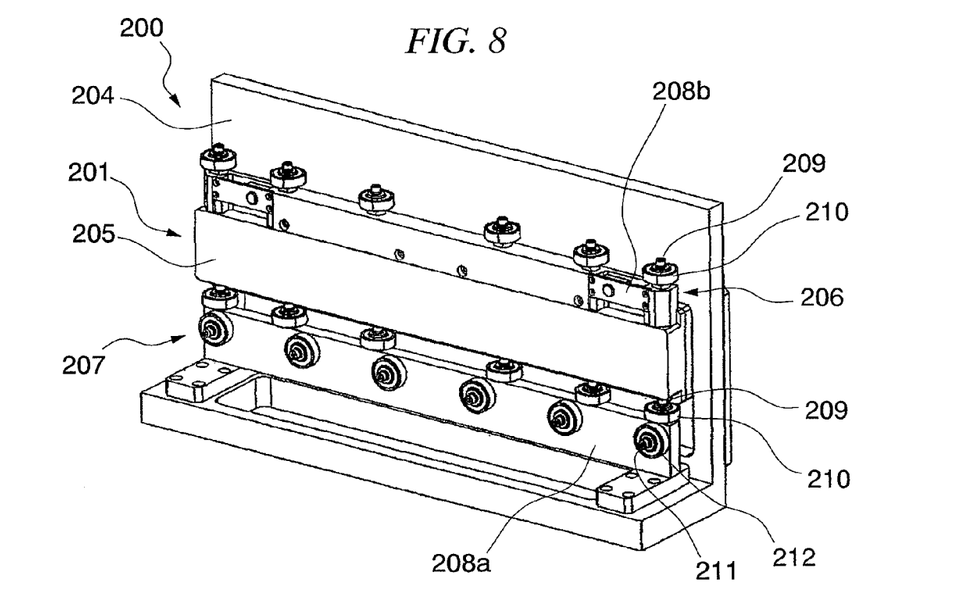
FIG. 8 is a perspective view illustrating a state in which the carrier of the conveyor mechanism shown in FIG. 7 is removed.

The in-line film forming apparatus to which the present invention is applied includes a conveyor mechanism 200 which conveys such a carrier 25. The conveyor mechanism 200 can be, for example, a linear motor drive mechanism 201 which drives the carrier 25 as illustrated in FIGS. 6, 7, and 8 in a noncontact state.

Specifically, the linear motor drive mechanism 201 has a magnetic body 202 provided at a side portion of the carrier 25, and a plurality of electromagnets 203 arranged in the conveying direction of the carrier 25 at a position which faces the magnetic body 202.

Although magnetic materials, such as iron and cobalt, which are attracted to the electromagnets 203, can be used for the magnetic body 202, it is preferable to use permanent magnets having an attractive or repulsive force to the electromagnets 203 in order to secure a high-speed response by the electromagnets 203. Additionally, it is preferable to use ferrite magnets, rare earth magnets, or the like as the permanent magnets. Among these, since the ferrite magnets are easy to machine and have a high degree of toughness, the magnets have an advantage in that they can be easily held in a portion of the carrier 25 with screws or the like. Additionally, since the rare earth magnets are difficult to machine and are brittle, but their attractive force or repulsive force to the electromagnets 203 is strong, the carrier 25 can be moved at a higher speed when such magnets are used for the linear motor drive mechanism 201. In addition, since the rare earth magnets are difficult to fix in place on the carrier 25 by screws or the like, it is preferable to cover the surfaces of the magnets with nonmagnetic materials, such as a stainless plate, and to employ a structure in which the magnetic body 202 is buried in the carrier 25. Additionally, it is preferable from the viewpoint of the strength of an attractive force or repulsive force that SmCo-based and NdFeB-based sintered magnets be used as the permanent magnets.

On the other hand, it is preferable to use an aluminum alloy for the carrier 25. Since the aluminum alloy is light, braking by the linear motor drive mechanism 201 is easy, and since the aluminum alloy is a nonmagnetic material, it is advantageous in attaching the magnetic body 202 thereto and putting on the brake. In addition, the aluminum alloy has little degassing in vacuum, and is convenient for maintaining high vacuum in the chambers 2, 52, 4 to 20, 54, or 3A. However, since the aluminum alloy has low wear resistance, it is preferable to use stainless steel or the like with high rigidity and a smooth surface for the portion of the carrier 25 which contacts a bearing which will be described later.

Although the electromagnets 203 are obtained by winding an electric wire in a coiled shape around a core, neither the core nor the electric wire is a suitable member used in vacuum, and it is not preferable that insulating coating of the electric wire is used in vacuum because that resin or the like is used for the coating. Thus, the present invention has adopted a structure in which a plurality of electromagnets 203 are placed in the conveying direction of the carrier 25 on a frame 204 provided at a side wall portion of each of the chambers 2, 52, 4 to 20, 54, and 3A, and the electromagnets are covered with an electromagnet cover 205. Thereby, the electromagnets 203 can be arranged outside (the atmosphere) each of the chambers 2, 52, 4 to 20, 54, and 3A. Therefore, it is possible to easily attain a high degree of vacuum in each chamber. As an example shown in FIG. 10B, the electromagnets 203 can be arranged in a closed space. As another example shown in FIG. 10C, the electromagnets 203 can be arranged so as to be connected with outside of a chamber. In addition, in order to make the distance between the electromagnets 203 and the magnetic body 202 as small as possible, it is preferable that the electromagnet cover 205 be made thin. As the material of the electromagnet cover 205, it is preferable to use a nonmagnetic material through which a magnetic field passes easily.

In such a linear motor drive mechanism 201, magnetic attraction or repulsion between the magnetic body 202 and the electromagnets 203 can be used to drive or stop (hold) the carrier 25 in a noncontact state. Additionally, in the linear motor drive mechanism 201, most of the self-weight of the carrier 25 is supported by a magnetic attractive force exerted between the magnetic body 202 and the electromagnets 203 so that the carrier 25 does not fall due to its own weight. Therefore, the resistance when the carrier 25 is conveyed is eliminated, and it is possible to move the carrier 25 to which the magnetic body 202 is attached at a high speed in response to high-speed change of S poles, N poles, and degaussing of the electromagnets 203. In addition, although the attractive force of the carrier 25 possessed by the linear motor drive mechanism 201 depends on the weight of the carrier 25, about 30 kgf (about 294 N) is required in the case of the carrier 25 having a weight of about several kilograms.

Figure 9:
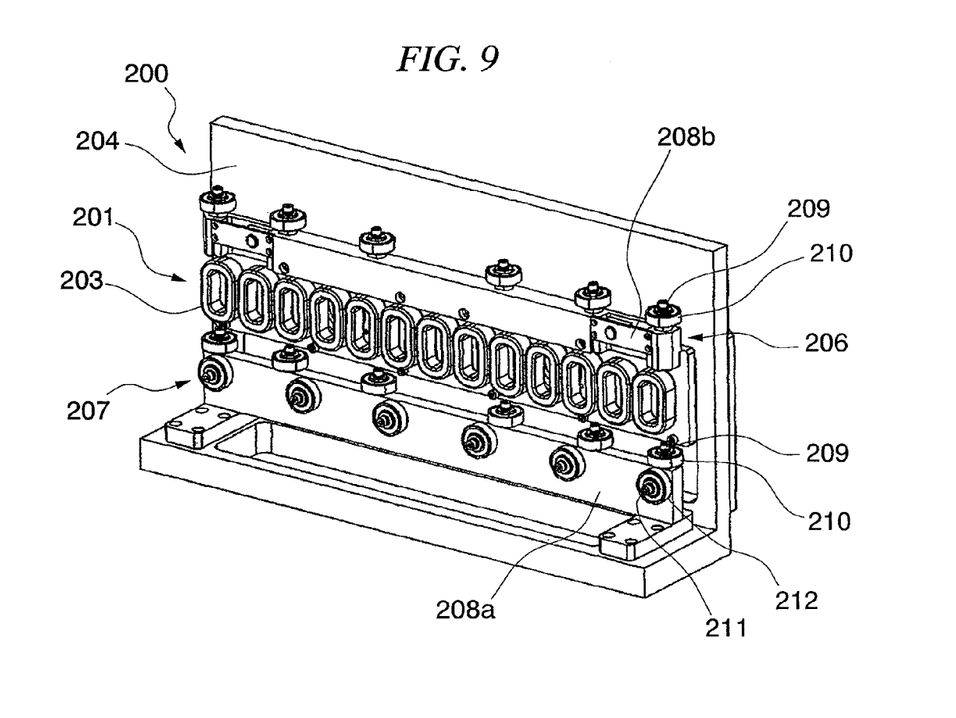
FIG. 9 is a perspective view illustrating a state in which an electromagnet cover of the conveyor mechanism shown in FIG. 8 is detached.

Additionally, the conveyor mechanism 200, as illustrated in FIG. 9, has a horizontal guide mechanism 206 which is provided so as to be able to contact the side portion of the carrier 25, and horizontally guides the carrier 25 driven by the linear motor drive mechanism 201, and a vertical guide mechanism 207 which is provided so as to be able to contact a lower end of the carrier 25, and guides the carrier 25 driven by the linear motor drive mechanism 201 in a vertical direction.

The horizontal guide mechanism 206 is constituted by a pair of upper and lower sub-frames 208a and 208b which is fixed to the frame 204 and arranged parallel to the conveying direction of the carrier 25, a plurality of shafts 209 which are attached to upper ends of the sub-frames, and arranged at equal intervals in the conveying direction of the carrier 25, and a plurality of bearings 210 which are rotatably attached to the plurality of shafts 209.

The vertical guide mechanism 207 is constituted by a lower sub-frame 208a, a plurality of shafts 211 which is attached to a side portion of the sub-frame and arranged at equal intervals in the conveying direction of the carrier 25, and a plurality of bearings 212 which is rotatably attached to the plurality of shafts 211.

Additionally, the bearings 210 and 212 which constitute the horizontal guide mechanism 206 and the vertical guide mechanism 207 are, for example, rolling bearings which reduce friction between machine parts and secure the smooth rotational motion of a machine.

Figures 10A, 10B:
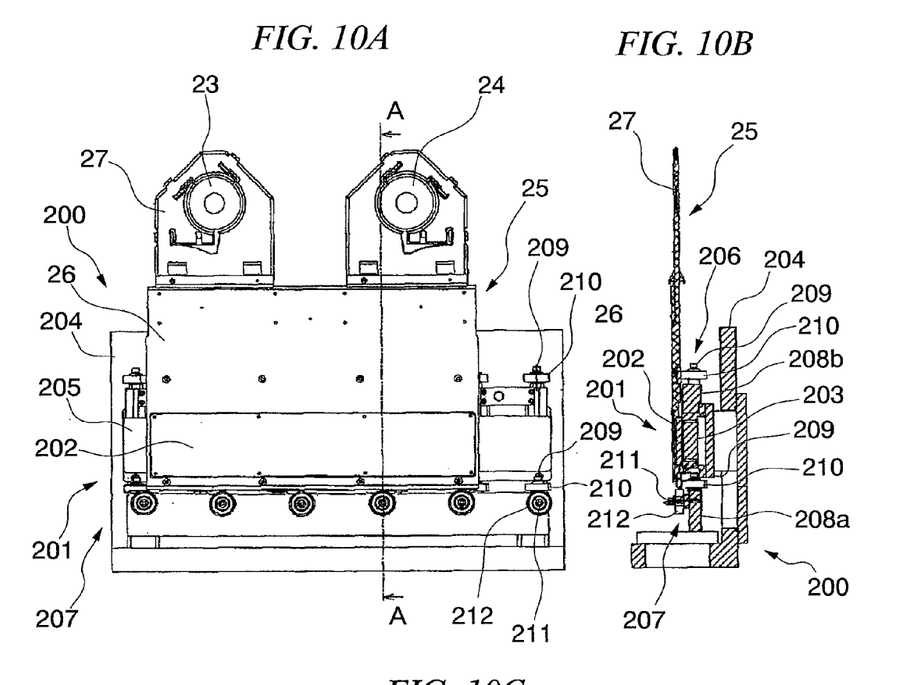
FIG. 10A is a front view of the conveyor mechanism.
FIG. 10B is an A-A sectional view.
Figure 10C:
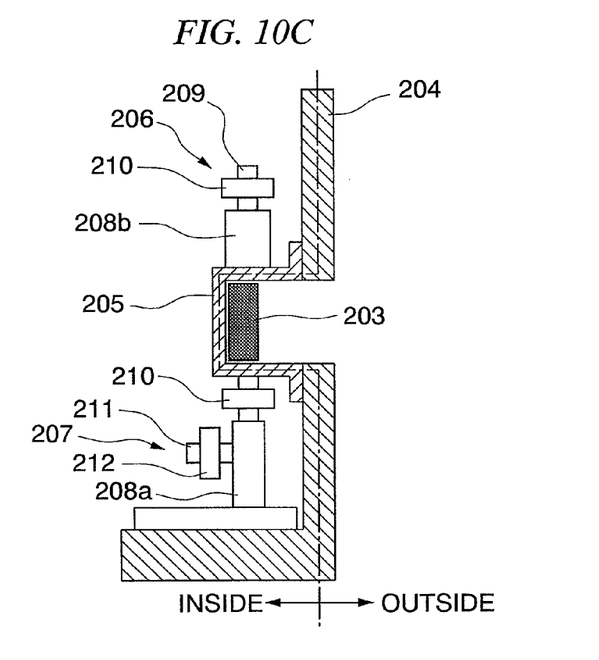
FIG. 10C is a sectional view of another example of the conveyor mechanism.

In the conveyor mechanism 200, as illustrated in FIGS. 10A and 10B, the bearings 210 of the plurality of bearings 210 and 212 which constitute the horizontal guide mechanism 206 contact the side portion of the carrier 25 (supporting base 26) driven or stopped by the linear motor drive mechanism 201, thereby regulating movement in a direction in which the carrier 25 approaches the electromagnet cover 205, and the bearings 212 which constitute the vertical guide mechanism 207 guide the carrier 25 (supporting base 26) driven or stopped by the linear motor drive mechanism 201 from below, thereby regulating movement in the direction in which the carrier 25 falls due to its own weight.

Thereby, in the conveyor mechanism 200, the load applied to the bearings 212 by contact with the carrier 25 can be reduced to a limit of zero, and the frictional force that the carrier 25 receives from the bearings 212 can be reduced to a limit of zero. As a result, it is possible to drive the carrier 25 by the linear motor drive mechanism 201 at a high speed.

In a conventional conveyor mechanism, the carrier 25 can be driven or stopped (held) in a noncontact state by a linear motor drive mechanism. However, when such a linear motor drive mechanism is adopted, the carrier 25 may vibrate during conveyance of the carrier 25.

This vibration occurs at a relatively low frequency. Due to this vibration, adverse effects such as the first and second film forming substrates 23 and 24 slipping out of the carrier 25 or plasma or the like becoming unstable during film formation may occur.

Additionally, in the bearings 210 and 212 used in the in-line film forming apparatus which requires a high degree of vacuum, in order to enhance sliding characteristics or rotation characteristics, it is not preferable to use liquid lubricant or the like, and there is also a limit on the lubricant which can be used. For this reason, in a conventional conveyer mechanism, when the carrier 25 is conveyed while a lot of the weight of the carrier 25 is supported by bearings or the like, conveyance of the carrier 25 at a high speed becomes difficult.

However, in the present invention, the bearings 210 and 212 which constitute the horizontal guide mechanism 206 and the vertical guide mechanism 207 prevent the carrier 25 from vibrating during conveyance. Additionally, by setting the load applied per bearing 212 which constitutes the vertical guide mechanism 207 to 0 N or setting the load applied per bearing 212 that the carrier 25 has contacted to 9.8 N or less, it is possible to drive the carrier 25 at a high speed by the linear motor drive mechanism 201.

In addition, according to the present inventor's analysis, it became clear that, when the carrier 25 having a weight of about several kilograms is conveyed a distance of about 1.5 m, about 0.5 second or less can be realized as the carrying time by setting the force applied per one of the bearings 212 which supports the carrier 25 to be less than or equal to 9.8 N (1 kgf). Additionally, as for the bearings 210 which support the carrier 25 from the side, it became clear that the same carrying time can be realized by setting the force applied per bearing to be less than or equal to 98 N (10 kgf).

Figure 11:
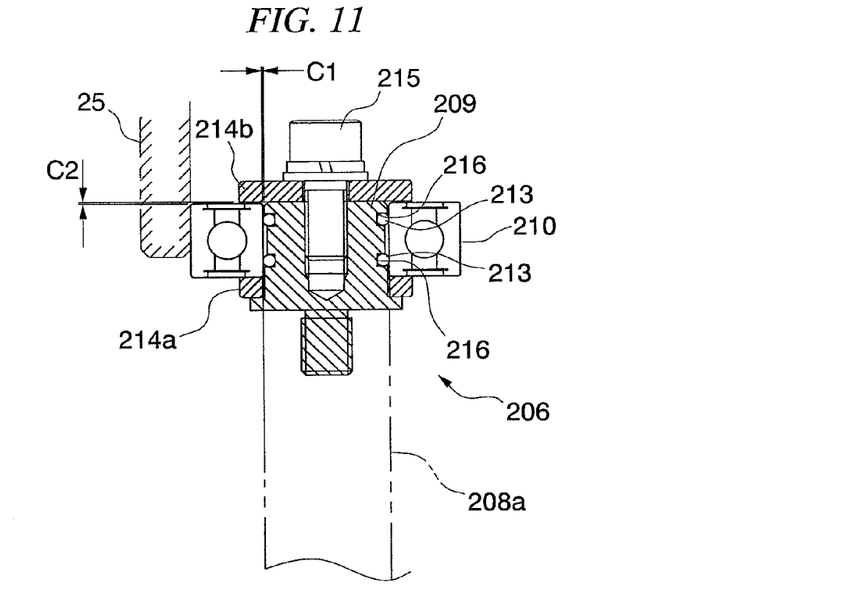
FIG. 11 is an exploded sectional view illustrating an attachment state of a shaft and a bearing of the horizontal guide mechanism.

In the conveyor mechanism 200 of the present invention, as illustrated in FIG. 11 in an enlarged manner, each bearing 210 is rotatably attached to the shaft 209 via a damping member 213, and the noncontact state between the shaft 209 and the bearing 210 is maintained via the damping member 213.

Specifically, the shaft 209 is attached by fastening a bolt portion provided at one end thereof to a bolt hole provided at an upper end of the sub-frame 208a. The bearing 210 is attached to the shaft 209 in a state which an outer ring thereof is rotatable by fastening a bolt 215 through a bolt hole of the shaft 209 while an inner ring thereof is pinched by washers 214a and 214b.

An O ring or the like made of rubber, such as fluororubber, or made of resin can be used for the damping member 213.

The damping member 213 is fitted and attached to a pair of outer peripheral grooves 216 provided in the outer peripheral surface of the shaft 209.

In the conveyor mechanism 200, a clearance C1 of about 0.1 to 0.2 mm is provided between the outer peripheral surface of the shaft 209 and the inner ring of the bearing 210 by interposing the damping member 213 between the shaft 209 and the bearing 210. Additionally, a clearance C2 of about 0.1 to 0.2 mm is also provided between the inner ring of the bearing 210, and the upper washer 214b.

Thereby, the bearing 210 becomes slightly movable with respect to the shaft 209. As a result, the damping member 213 absorbs vibration which is transmitted to the carrier 25 by contact with the bearing 210, and, in particular, absorbs the vibration in a high frequency region which is easy to transmit by metal, so that such vibration can be prevented from being transmitted to the carrier 25 during conveyance.

Figure 12A:
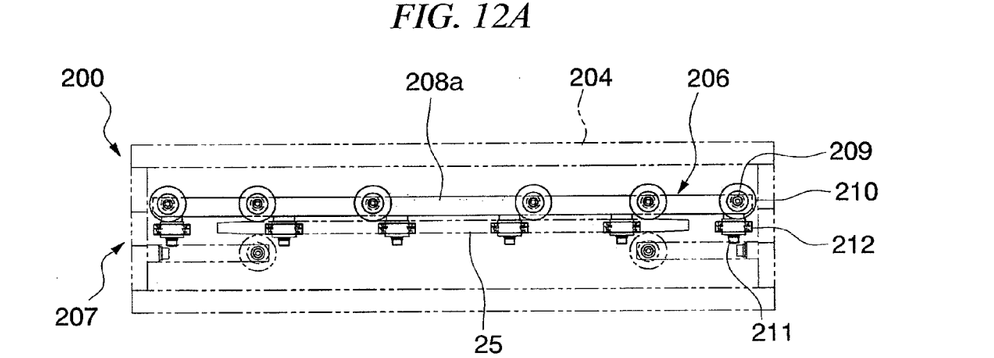
FIG. 12A is a plan view of the horizontal guide mechanism.
Figure 12B:
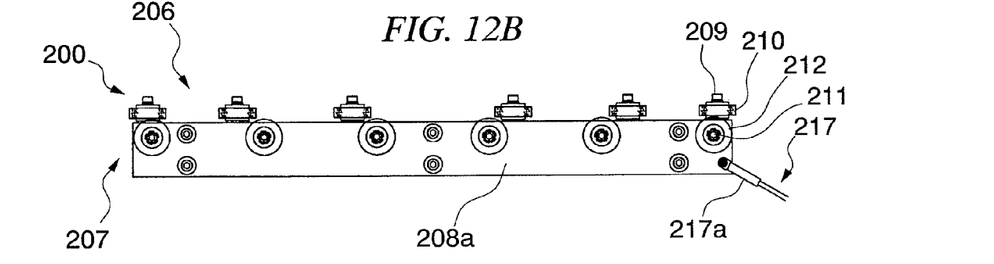
FIG. 12B is a side view of the horizontal guide mechanism.

Additionally, as illustrated in FIGS. 12A and 12B, the conveyor mechanism 200 is provided with a sensor 217 which detects contact with the shaft 209 and the bearing 210. By attaching a monitor terminal 217a to the sub-frame 208a, the sensor 217 detects an electrical connection state when the shaft 209 and the bearing 210 have contacted each other. Thereby, contact with the shaft 209 and the bearing 210 caused by wear, deformation, or the like of the damping member 213 can be detected, and the appropriate replacement timing of the damping member 213 can be grasped.

In addition, in order to detect contact with the shaft 209 and the bearing 210 by the sensor 217, it is necessary to electrically insulate the shaft 209 and the bearing 210 from each other. For this reason, the insulating washers 214a and 214b made of an insulating material besides the damping member 213 are interposed between the shaft 209 and the bearing 210, and the shaft 209 and the bearing 210 are electrically insulated from each other.

In addition, in the conveyor mechanism 200, the configuration in which the damping member 213 and the sensor 217 are provided on the side of the horizontal guide mechanism 206 has been described using the above FIGS. 11 and 12. However, the conveyor mechanism similarly has the configuration in which the damping member 213 and the sensor 217 are provided on the side of the vertical guide mechanism 207.

That is, in the conveyor mechanism 200, the bearing 212 is rotatably attached to the shaft 211 via the damping member 213, and the noncontact state between the shaft 211 and the bearing 212 is maintained via the damping member 213. Thereby, the damping member 213 absorbs the vibration which is transmitted to the carrier 25 by contact with the bearing 212, and, in particular, absorbs the vibration in a high frequency region which is easy to transmit by metal, so that such vibration can be prevented from being transmitted to the carrier 25 during conveyance.

Additionally, in the conveyor mechanism 200, the sensor 217 which detects contact with the shaft 211 and the bearing 212 is provided. Thereby, contact with the shaft 209 and the bearing 210 caused by wear, deformation, or the like of the damping member 213 can be detected by the sensor 217, and the appropriate replacement timing of the damping member 213 can be grasped.

As described above, since the conveyance speed of the carrier 25 can be accelerated in the in-line film forming apparatus to which the present invention is applied, it is possible to enhance the manufacturing capacity of magnetic recording media. Additionally, since it is possible to enhance the exhaust capability within a treatment chamber, to perform introduction or exhaust of process gas into/from the treatment chamber at a high speed, and to smoothly perform a film forming process of a magnetic recording medium, it is consequently also possible to enhance the manufacturing capacity of magnetic recording media. Additionally, since a high degree of vacuum of the treatment chamber can be easily secured, manufacture of high-quality magnetic recording media can be attained, and it is also possible to successfully undertake more advanced film forming techniques, such as reactive sputtering.

In addition, the present invention is not necessarily limited to the above embodiment, and various modifications can be made without departing from the spirit and scope of the present invention. Additionally, in the following description, description of parts equivalent to those above are omitted, and the same reference numerals shall be given to the parts in the drawings.

Figure 13:
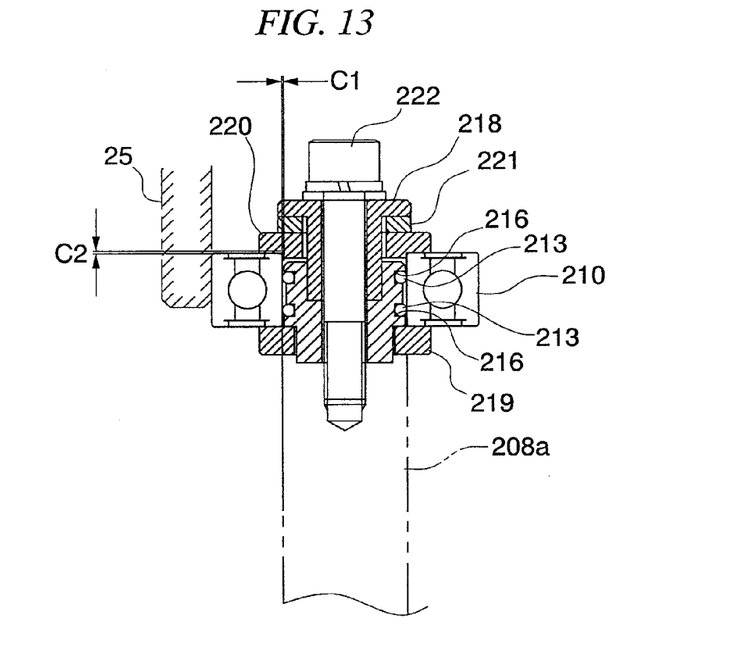
FIG. 13 is an exploded sectional view showing an attachment state of a shaft and a bearing of another horizontal guide mechanism.

Specifically, in the above conveyor mechanism 200, for example, a configuration as illustrated in FIG. 13 can be adopted. That is, in a horizontal guide mechanism 206 illustrated in FIG. 13, the shaft 209 and the bearing 210 as well as the damping member 213 are electrically insulated via an insulating boss 218 or an insulating washer 219. Moreover, a bolt 222 which passes through the shaft 209 via a washer 220 or a delivery plate 221 made of stainless steel or the like is fastened to a bolt hole provided at an upper end of the sub-frame 208a.

Even in this case, the bearing 210 is rotatably attached to the shaft 209 via the damping member 213, and the noncontact state between the shaft 209 and the bearing 210 is maintained via the damping member 213. Thereby, the damping member 213 absorbs the vibration which is transmitted to the carrier 25 by contact with the bearing 210, and, in particular, absorbs the vibration in a high frequency region which is easy to transmit by metal, so that such vibration can be prevented from transmitting to the carrier 25 during conveyance.

Figure 14A:
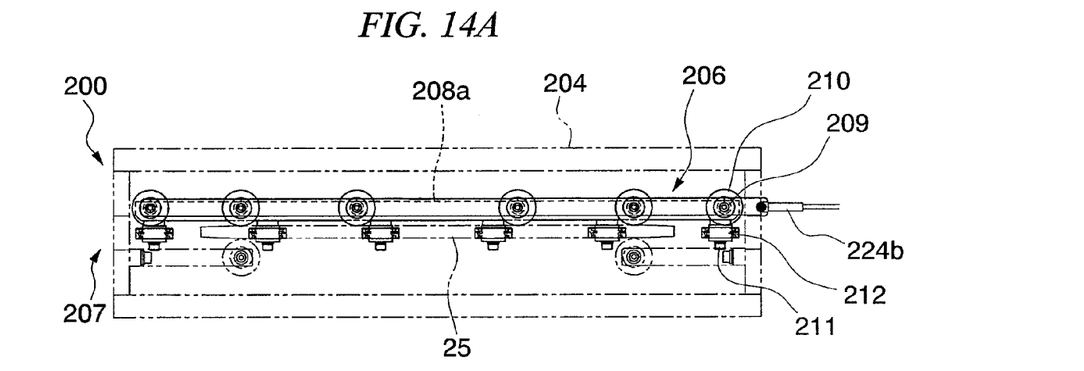
FIG. 14A is a plan view of the other horizontal guide mechanism.
Figure 14B:
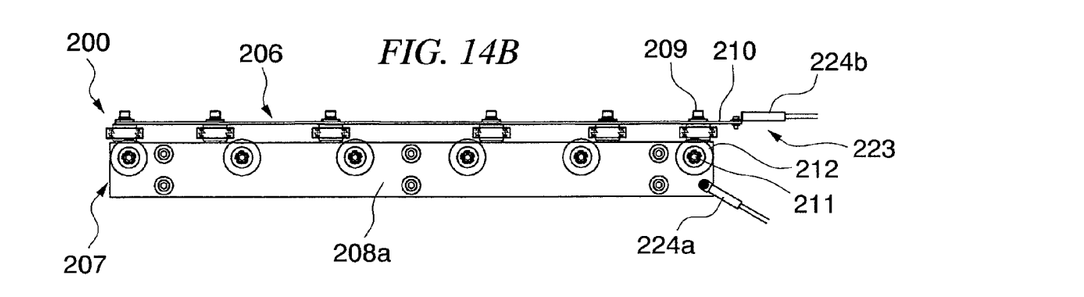
FIG. 14B is a side view of the other horizontal guide mechanism.

Additionally, in the above conveyor mechanism 200, for example, a configuration may be adopted, as illustrated in FIGS. 14A and 14B, in which a sensor 223 which detects contact with the shaft 209 and the bearing 210 is provided. By attaching monitor terminals 224a and 224b to the shaft 209 and the bearing 210, the sensor 223 detects contact with the shaft 209 and the bearings 210 while detecting a change in capacitance between the terminals 224a and 224b. Thereby, wear or deformation of the damping member 213 can be detected, and the appropriate replacement timing of the damping member 213 can be known.

In addition, although description is omitted in the above conveyor mechanism 200, the vertical guide mechanism 207 similarly can also have a configuration in which the damping member 213 illustrated in FIG. 13 is provided, and a configuration in which the sensor 224 illustrated in FIG. 14 is provided.

While preferred embodiments of the present invention have been described and illustrated above, it should be understood that these are exemplary of the present invention and are not to be considered as limiting. Additions, omissions, substitutions, and other modifications can be made without departing from the spirit or scope of the present invention.

What is claimed is:

1. A manufacturing method of a magnetic recording medium, comprising a step of forming at least a magnetic layer on the surface of a substrate by conveying the substrate between a plurality of film forming chambers in an in-line film forming apparatus wherein the in-line film forming apparatus comprising:

a plurality of film forming chambers in which film forming processing is performed;

a carrier which holds a substrate serving as an object to be film-formed within the plurality of film forming chambers in a vertical arrangement, wherein the carrier has an upper end that contains a substrate mounting portion and lower end below the substrate mounting portion; and
a conveyor mechanism which sequentially conveys the carrier through the plurality of film forming chambers,
wherein the conveyor mechanism comprises
   a linear motor drive mechanism which drives the carrier in a noncontact state;
   a horizontal guide mechanism which is provided so as to be able to contact a side portion of the carrier, and guides the carrier driven by the linear motor drive mechanism in a horizontal direction; and
   a vertical guide mechanism which is provided so as to be able to contact a lower end of the carrier, and guides the carrier driven by the linear motor drive mechanism in the vertical direction,
   wherein the horizontal guide mechanism or the vertical guide mechanism comprises
      a plurality of bearings,
      a plurality of shafts, and
      a damping member,
   wherein the plurality of bearings is rotatably attached to the plurality of shafts arranged in the conveying direction of the carrier via the damping member, and a noncontact state between the shafts and the bearings is maintained via the damping member, and then, the damping member absorbs vibration which is transmitted to the carrier by contact with the bearing;
   the load applied each bearing constituting the vertical guide mechanism is 0 N, or the load applied each bearing that the carrier has contact with, among the plurality of bearings constituting the vertical guide mechanism, is less than or equal to 9.8 N; and
   the load applied each bearing that the carrier has contact with, among the plurality of bearings which constitute the horizontal guide mechanism, is less than or equal to 98 N.

2. The manufacturing method of a magnetic recording medium according to claim 1,
   wherein the damping member is an O ring.

3. The manufacturing method of a magnetic recording medium according to claim 1,
   wherein the in-line film forming apparatus further comprises a sensor which detects contact between the shafts and the bearings.

4. The manufacturing method of a magnetic recording medium according to claim 1,
   wherein the linear motor drive mechanism further comprises
      a magnetic body provided at a side portion of the carrier, and
      a plurality of electromagnets arranged in the conveying direction of the carrier at a position which faces the magnetic body.

5. The manufacturing method of a magnetic recording medium according to claim 4,
   wherein the magnetic body is a permanent magnet.

6. The manufacturing method of a magnetic recording medium according to claim 4,
   wherein the electromagnets are provided outside the film forming chambers.

* * * * *